US011621218B1

United States Patent
Tang et al.

(10) Patent No.: US 11,621,218 B1
(45) Date of Patent: Apr. 4, 2023

(54) SINGLE SIDE MODULAR 3D STACK UP SIP WITH MOLD CAVITY

(71) Applicant: Dialog Semiconductor (UK) Limited, London (GB)

(72) Inventors: Shih-Wen Tang, Taichung (TW); Jesus Mennen Belonio, Germering (DE); Che-Han Li, Taichung (TW)

(73) Assignee: Dialog Semiconductor (UK) Limited, London (GB)

( * ) Notice: Subject to any disclaimer, the term of this patent is extended or adjusted under 35 U.S.C. 154(b) by 39 days.

(21) Appl. No.: 17/245,588

(22) Filed: Apr. 30, 2021

(51) Int. Cl.
| | | |
|---|---|---|
| *H01L 23/498* | (2006.01) | |
| *H01L 25/065* | (2023.01) | |
| *H01L 23/00* | (2006.01) | |
| *H01L 21/56* | (2006.01) | |
| *H01L 25/00* | (2006.01) | |

(52) U.S. Cl.
CPC ...... *H01L 23/49816* (2013.01); *H01L 21/565* (2013.01); *H01L 23/49866* (2013.01); *H01L 24/13* (2013.01); *H01L 24/16* (2013.01); *H01L 24/48* (2013.01); *H01L 24/73* (2013.01); *H01L 24/81* (2013.01); *H01L 25/0652* (2013.01); *H01L 25/50* (2013.01); *H01L 2224/13147* (2013.01); *H01L 2224/16225* (2013.01); *H01L 2224/48145* (2013.01); *H01L 2224/48225* (2013.01); *H01L 2224/73207* (2013.01); *H01L 2224/73253* (2013.01); *H01L 2924/3511* (2013.01)

(58) Field of Classification Search
CPC ............. H01L 23/49816; H01L 21/565; H01L 23/49866
See application file for complete search history.

(56) References Cited

U.S. PATENT DOCUMENTS

| | | | |
|---|---|---|---|
| 8,581,405 B2 | 11/2013 | Dertinger et al. | |
| 9,565,774 B2 | 2/2017 | Lee | |
| 9,711,502 B2 | 7/2017 | Huang et al. | |
| 10,636,742 B2 | 4/2020 | Belonio, Jr. et al. | |
| 2016/0174381 A1 | 6/2016 | Lee et al. | |
| 2016/0307847 A1 | 10/2016 | Lee et al. | |
| 2019/0131212 A1* | 5/2019 | Baek | H01L 24/14 |
| 2020/0373259 A1 | 11/2020 | Koller et al. | |

* cited by examiner

*Primary Examiner* — Errol V Fernandes
(74) *Attorney, Agent, or Firm* — Saile Ackerman LLC; Stephen B. Ackerman; Rosemary L. S. Pike

(57) ABSTRACT

A single-side stack up system in package is described. The system in package comprises a first interconnection having redistribution layers therein and having a top surface and a bottom surface, at least one first silicon die mounted on the top surface of the first interconnection and embedded in a first molding compound, at least one first passive component mounted on the top surface of the first interconnection side-by-side with the at least one first silicon die and embedded in a second molding compound, and solder balls mounted on the bottom surface of the first interconnection wherein the solder balls provide package output.

14 Claims, 8 Drawing Sheets

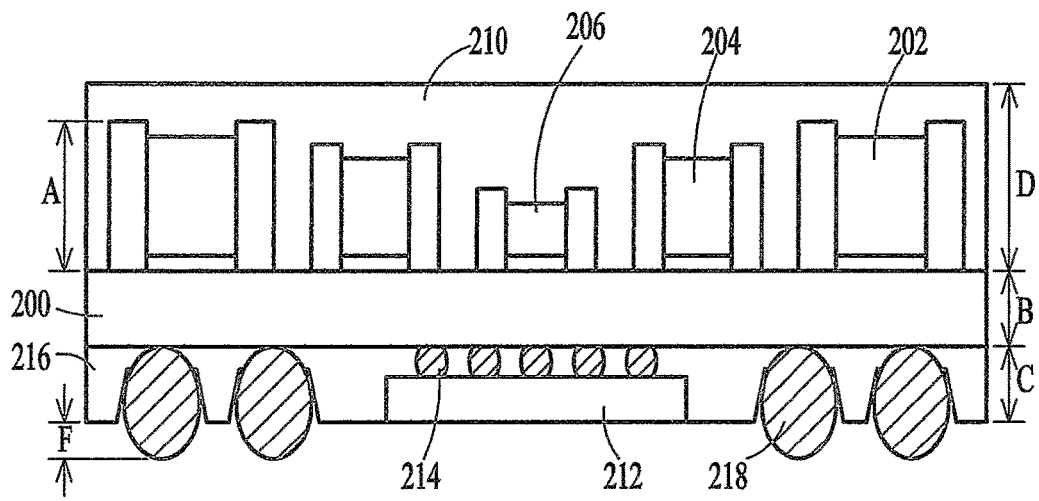
Figure 1 Prior Art
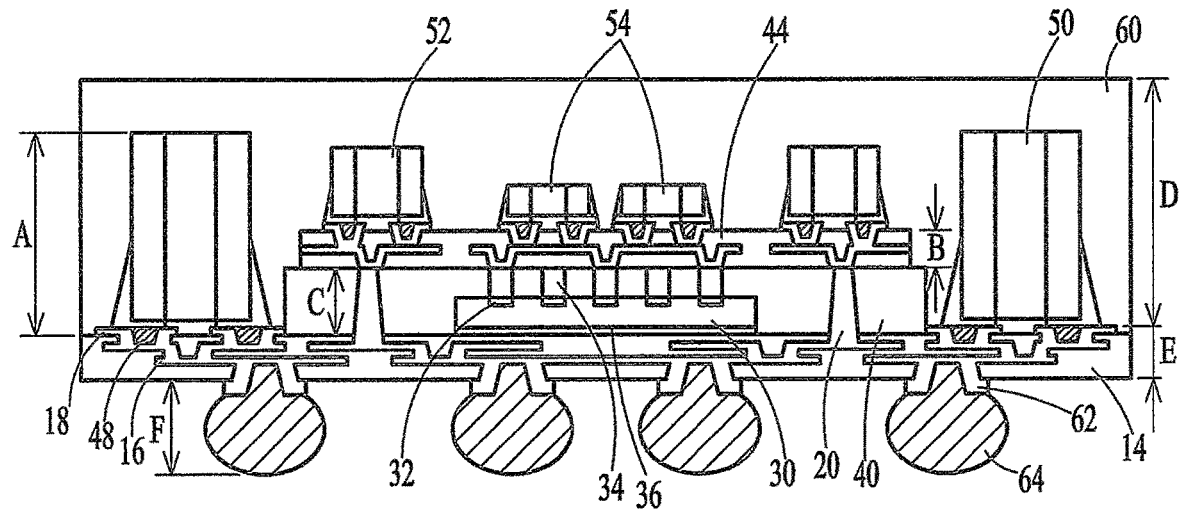
Figure 2
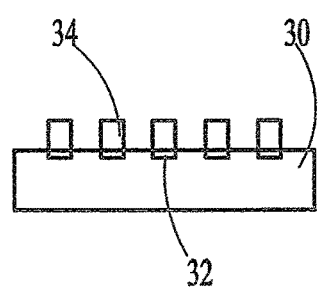 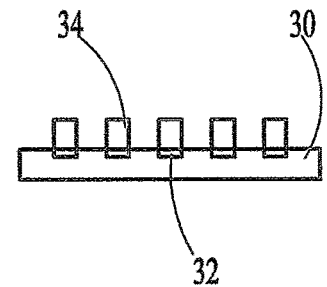
Figure 3A    Figure 3B

SINGLE SIDE MODULAR 3D STACK UP SIP WITH MOLD CAVITY

(1) TECHNICAL FIELD

This disclosure is related to system in package (SIP) technologies, and more particularly, to SIP technologies integrating a silicon die and passive components on a single side of a 3D stack up package.

(2) BACKGROUND

The internet of things (IOT) involves billions of mobile devices connected to the cloud with infinite possibilities for data. Each of these devices will require, at a minimum, a microcontroller to add intelligence to the device, one or more sensors to allow for data collection, one or more chips to allow for connectivity and data transmission, and a memory component. Semiconductor device manufacturers are constantly confronted with device integration challenges as consumers want electronics to be smaller, more portable, and more multi-functional than ever.

Some traditional system in package (SIP) technologies include embedded die substrates or embedded wafer level package eWLP, die side-by-side wire-bonded SIP's, small outline integrated circuit packages (SOIC), quad flat no-lead packages (QFN), and fan-out type SIP's.

U.S. Pat. No. 9,565,774 (Lee), 9,711,502 (Huang et al), and 8,581,405 (Dertinger et al) and U.S. Patent Applications 2016/0307847 (Lee et al), 2016/0174381 (Lee et al) and 2020/0373259 (Koller et al) are all in the field of systems-in-package (SIP).

SUMMARY

It is the primary objective of the present disclosure to reduce the total package Z height and eliminate the warpage risk of a system in package.

It is a further objective of the present disclosure to integrate a silicon die and passive components on one side of a 3D stack up package.

In accordance with the objectives of the present disclosure, a single-side stack up system in package is achieved. The system in package comprises a first interconnection having redistribution layers therein and having a top surface and a bottom surface, at least one first silicon die mounted on the top surface of the first interconnection and embedded in a first molding compound, at least one first passive component mounted on the top surface of the first interconnection side-by-side with the at least one first silicon die and embedded in a second molding compound, and solder balls mounted on the bottom surface of the first interconnection wherein the solder balls provide package output.

Also in accordance with the objectives of the present disclosure, a single-side stack up system in package is achieved. The system in package comprises a first interconnection having redistribution layers therein and having a top surface and a bottom surface and having first copper posts on the top surface. At least one first silicon die is mounted on the top surface of the first interconnection not on the first copper posts wherein the at least one silicon die and the first copper posts are embedded in a first molding compound except for tops of the first copper posts and tops of copper pillars on a top surface of the at least one first silicon die. At least one first passive component is mounted on the top surface of the first interconnection side-by-side with the at least one first silicon die. A second interconnection having redistribution layers therein and having a top surface and a bottom surface is fabricated on the first copper posts on the top surface of the first interconnection wherein the bottom surface of the second interconnection overlies the at least one first silicon die and the first molding compound. At least one active or passive component is mounted on a top surface of the second interconnection wherein the at least one first passive component, the second interconnection, and the at least one active or passive component are embedded in a second molding compound. Solder balls are mounted on the bottom surface of the first interconnection wherein the solder balls provide package output.

Also in accordance with the objectives of the present disclosure, a method to fabricate a single-side stack up system in package is achieved. At least one silicon die having a top side and a bottom side is provided wherein a plurality of copper pillars on the top side connect to a circuit layer within the silicon die. A first interconnection is provided having redistribution layers therein and having a top side and a bottom side. The bottom side of the at least one silicon die is die attached to the top side of the first interconnection. Photoresist masks are formed on areas of the top surface of the first interconnection where passive components will be mounted. Thereafter, the at least one first silicon die is embedded in a first molding compound. Then, the first molding compound is lapped to expose tops of the plurality of copper pillars and to expose tops of the photoresist masks. The photoresist masks are removed to form cavities in the first molding. At least one first passive component is mounted in at least one of the cavities on the top side of the first interconnection side-by-side with the at least one first silicon die. The at least one passive component is embedded in a second molding compound. Solder balls are mounted on the bottom side of the first interconnection connecting to the redistribution layers wherein the solder balls provide package output.

BRIEF DESCRIPTION OF THE DRAWINGS

In the accompanying drawings forming a material part of this description, there is shown:

FIG. 1 is a cross-sectional representation of a system in package of the prior art.

FIG. 2 is a cross-sectional representation of a system in package in a first preferred embodiment of the present disclosure.

FIGS. 3A through 3C are cross-sectional representations of steps in a die process with copper pillars on a top surface of the first silicon die to fabricate the system in package in the first preferred embodiment of the present disclosure.

DETAILED DESCRIPTION

Figure 3C:
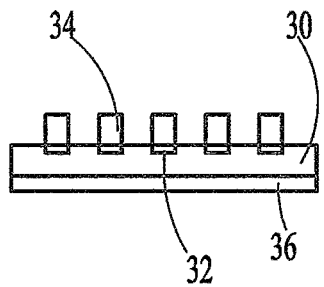

A challenge for the double sided package structure comes when passive components on one side of the package are not able to be offered in a thin form type, for example, large inductors. This would lead to a thicker top mold thickness. Consequentially, the thicker top mold and thinner bottom mold would cause a warpage risk concern due to the bigger unbalanced double side molding structure.

The package structure of the present disclosure is a single sided stack up system in package (SIP) that reduces package Z height and eliminates the warpage risk concern from an unbalanced double side molding.

FIG. 1 illustrates a double-sided system-in-package (SIP). A silicon die 212 is attached on one side of the substrate 200 while passive components 202, 204, and 206 are attached on the opposite side of the substrate. Molding 216 encapsulates the die and Molding 210 encapsulates the passive components.

Table 1 illustrates typical thicknesses of the various components of a double-sided SIP, such as illustrated in FIG. 1, in the third column and of the single-sided 3D stack up SIP of the present disclosure in the fourth column.

TABLE 1

| | Stack up for pkg total height | Double-sided SIP | Single-sided Modular 3D Stack up SIP with cavity |
|---|---|---|---|
| A | Max component thickness (μm) | 700 max | 700 max |
| B | Substrate/2nd bumping RDL thickness (μm) | 125 | 25 |
| C | Molding-1 Thickness (μm) | 80 | 90 |
| D | Molding-2 Thickness (μm) | 780 | 780 |
| E | 1st bumping RDL thickness (μm) | N/A | 53 |
| F | Ball Stand-off (μm) | 50 | 90 |
| | Total package thickness (μm) | >1000 = | <1000 |

FIG. 2 illustrates a sample Single Side Modular 3D Stack Up SiP of the present disclosure. A silicon die 30 is attached to a first bumping redistribution layer (RDL) interconnection 14. Large passive components 50 are mounted on the first bumping RDL interconnection 14 side-by-side with the silicon die 30. Smaller passive components 52 and 54 are mounted on a second bumping RDL interconnection mounted over the silicon die 30. First molding 40 over the die 30 and second molding 60 over the passive components are both on the same side of the first bumping RDL interconnection 14, so there is no warpage risk as in the double-side molding package of the prior art.

The SIP of the present disclosure is a Single Side Modular 3D Stack SIP that has the advantage of a low profile in the total package Z height. The single-sided structure also has less warpage risk concern since there is not an unbalanced double side molding. Additional advantages include expansion of integration in various package structures as 3D Stack SIP. That is, not only passive components, but also active chips can be included in the SIP using both flip chip and wire bond die preparation.

As shown in FIG. 2, large passive components 50 such as large inductors are mounted side-by-side next to an embedded die. This results in a thin profile structure. The process of fabricating the Single Side Modular 3D Stack Up SiP of the present disclosure adopts the technologies of Chip Reconstitution, Bumping Redistribution Layer, and Copper Post Interconnection. The present disclosure integrates one or more silicon dies and passive components on one side of a package.

The total overall SIP package height is defined by first bumping RDL interconnection thickness E, maximum passive components height and one-side molding process thickness D and ball 64 thickness F. For example, the total package height may be below a target of about 1000 μm.

The fabrication process of the Single Side 3D Stack Up SIP of the present disclosure will be further described in detail with reference to FIGS. 3A-3C, 4A-4E, and 5A-5K. Referring now to FIGS. 3A-3C, the silicon die or dies are prepared. FIG. 3A illustrates a portion of a silicon die 30. Active circuits are formed within the silicon die (not shown) with conductive pads 32 exposed at a top surface of the die. Copper pillar bumps 34 are made connecting to the conductive pads 32. Next, as shown in FIG. 3B, the wafer may be thinned to the desired die thickness. Die attach film (DAF) 36 is coated on the thinned bottom side of the wafer for pad face up die bonding process adhesion architectures. Next, the wafer is singulated into individual dies 30, as shown in FIG. 3C.

Figure 4A:
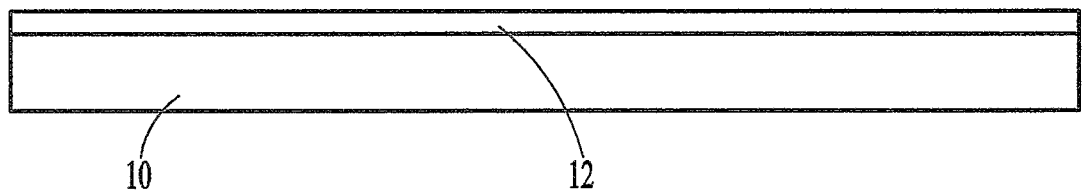
FIGS. 4A through 4D are cross-sectional representations of steps in a first bumping RDL and first copper posts preparation process to fabricate the system in package in the first preferred embodiment of the present disclosure.
Figure 4B:
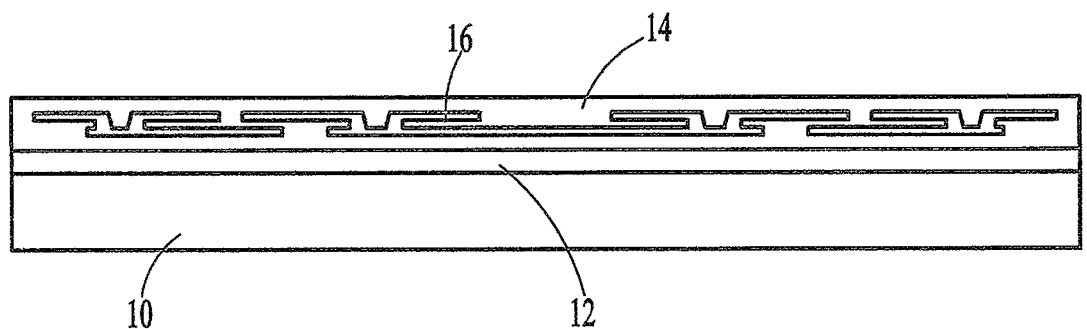
Figure 4C:
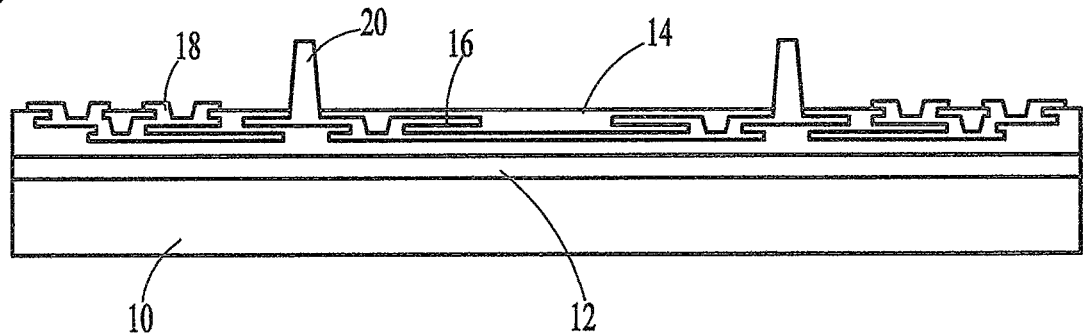

Next, referring to FIGS. 4A-4D, a first bumping RDL interconnection is prepared. Referring now more particularly to FIG. 4A, there is shown a glass carrier 10. The glass carrier can provide a support for in-process warpage management. A release layer 12 is coated on the glass carrier 10. Now, in FIG. 4B, metal redistribution layers (RDL) 16, preferably copper traces, are formed within dielectric layers in the first bumping interconnection which is formed on the release layer 12. Now, topmost metal layers are formed, as shown in FIG. 4C. These may be under bump metallization (UBM) 18 and copper posts 20 as the interconnection throughway between the first and second bumping RDL interconnections in the package. There may be three RDL layers or there may be more or fewer than three layers, depending on the electrical performance of the package and desired package height.

Figure 4D:
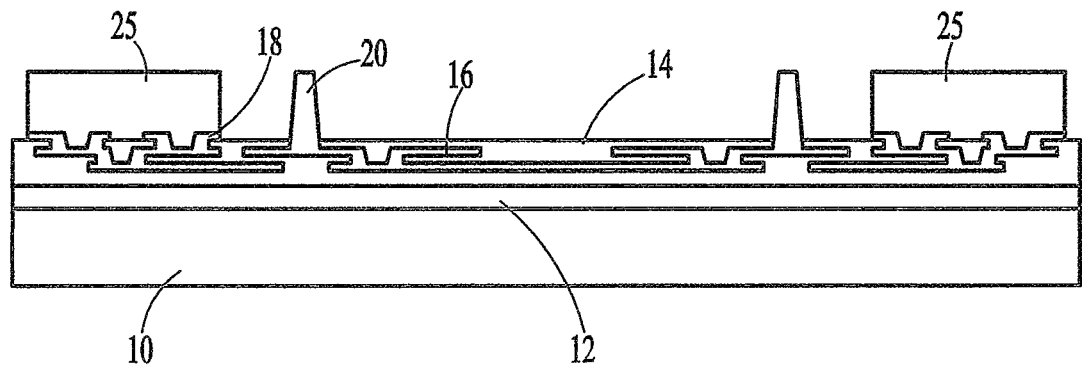

Now, as shown in FIG. 4D. a photoresist layer is coated over the first bumping RDL 16 interconnection and patterned to form photoresist masks 25 in areas where tall passive components will be mounted onto the first bumping RDL.

Figure 5A:
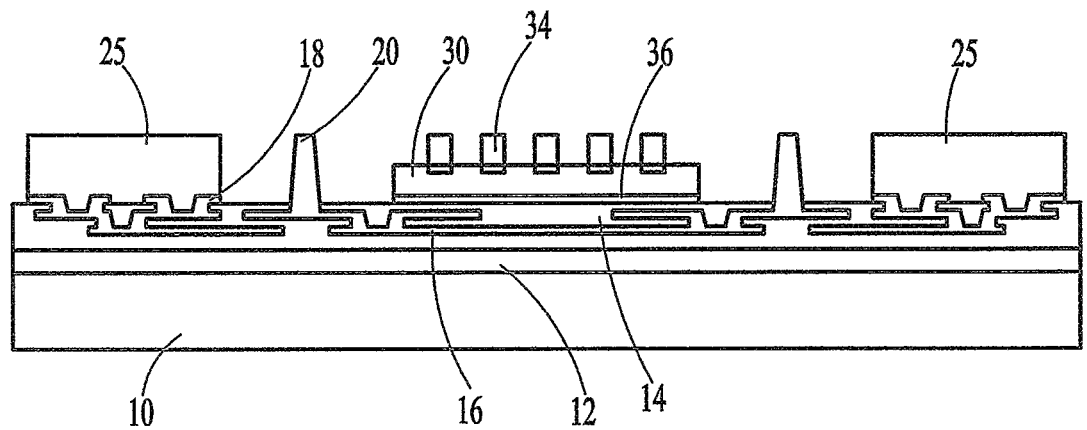
FIGS. 5A through 5K are cross-sectional representations of steps in a wafer level packaging process to fabricate the system in package in the first preferred embodiment of the present disclosure.
Figure 5B:
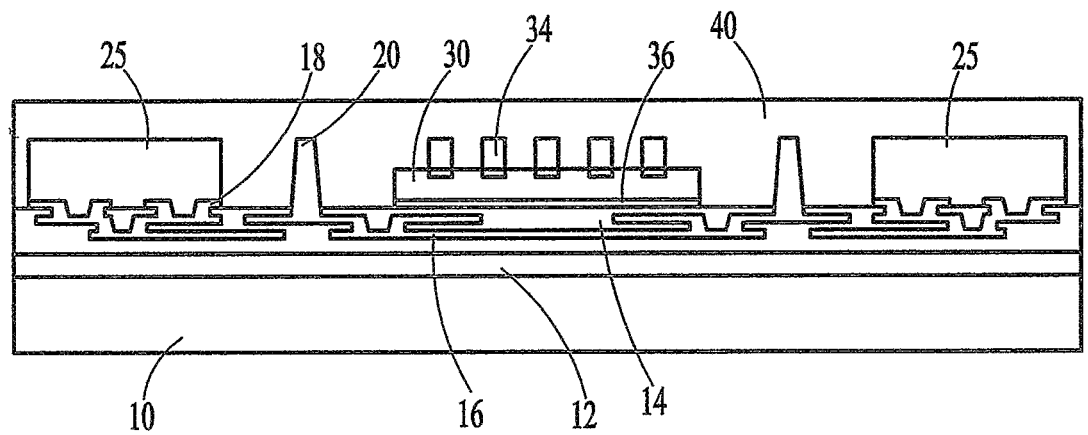

Next, referring to FIGS. 5A-5K, the wafer level package is fabricated. As illustrated in FIG. 5A, pad face up die bonding is performed to bond the die 30 to the first bumping RDL 16 using die attach film 36. Now, in FIG. 5B. a first wafer form compression molding is performed. First molding 40 is coated over the first bumping RDL 14, the die 30, the posts 20, and the photoresist mask 25.

Figure 5C:
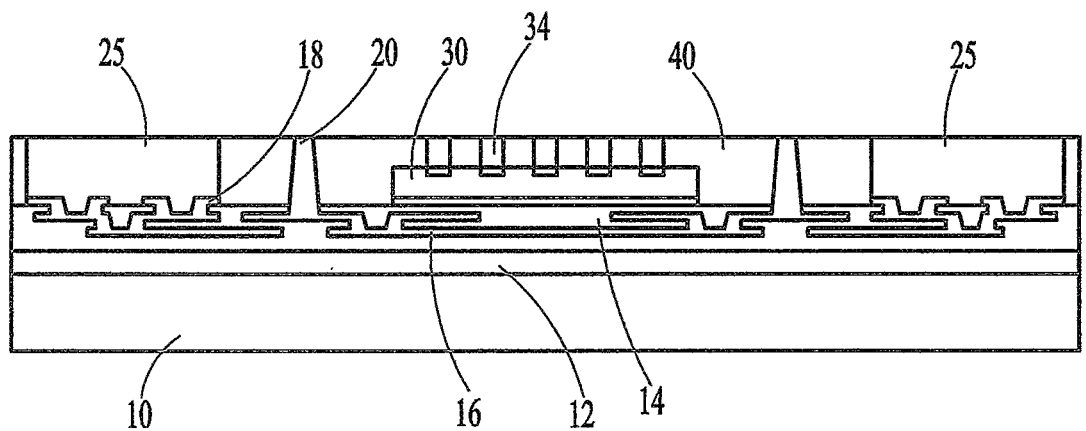

Now an epoxy molding compound lapping is performed to expose the copper pillars 34 of the die 30 as well as the copper posts 20 of RDL layers, as shown in FIG. 5C.

Figure 5D:
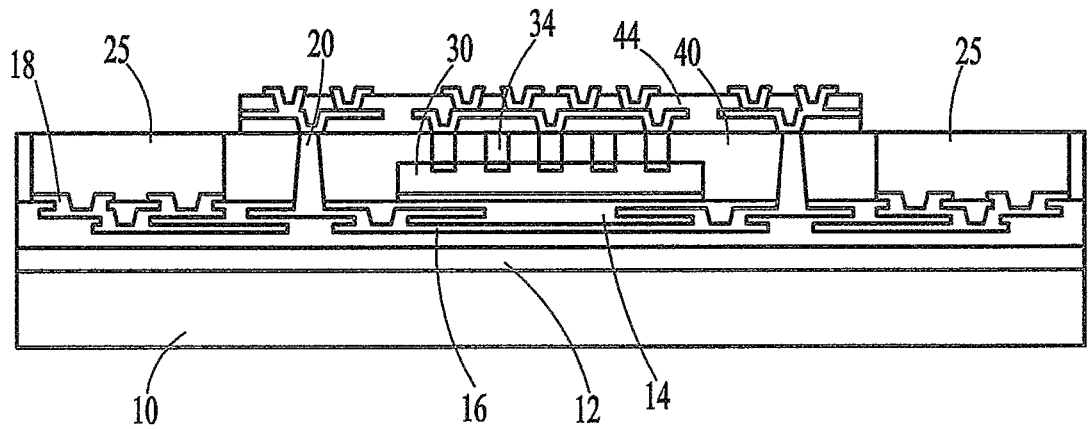
Figure 5E:
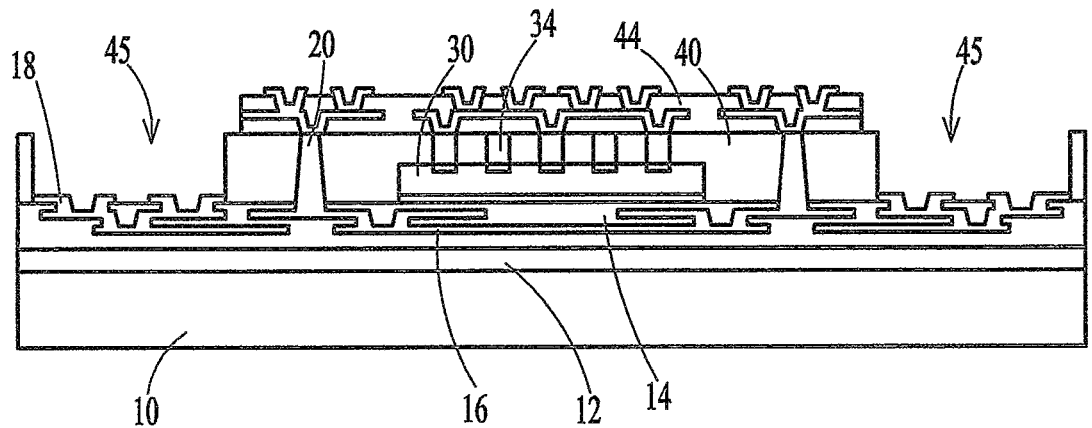

Now, in a three-dimensional stack up, a second partial bumping RDL 44 interconnection is formed on the molding compound 40, as shown in FIG. 5D. RDL layers within the second bumping RDL 44 interconnection interconnect the die I/O 34 and top/bottom RDL layer communication through copper posts 20 in a 3D stacking form. Next, as shown in FIG. 5E, the photoresist masks are stripped to reveal mold cavities 45 in the package.

Figure 5F:
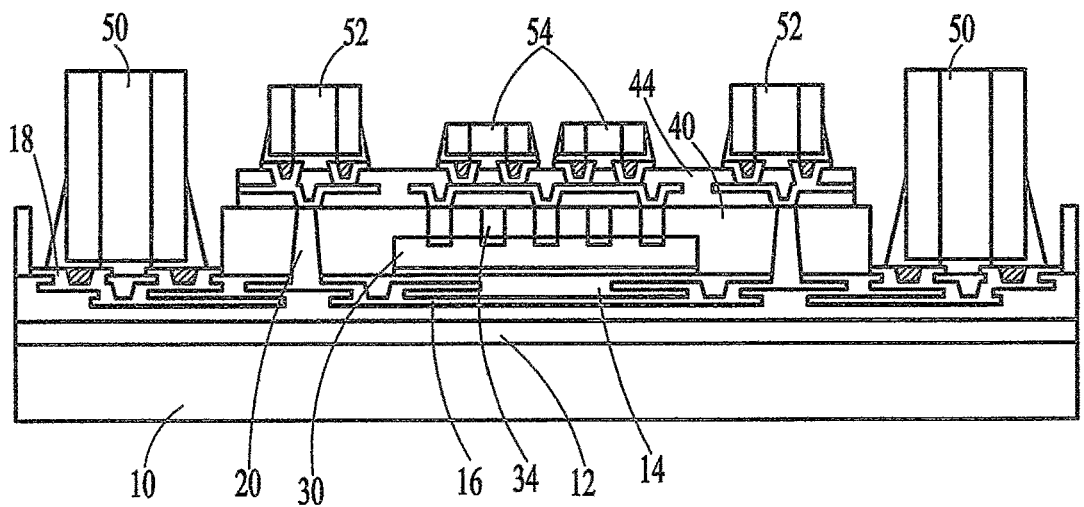
Figure 5G:
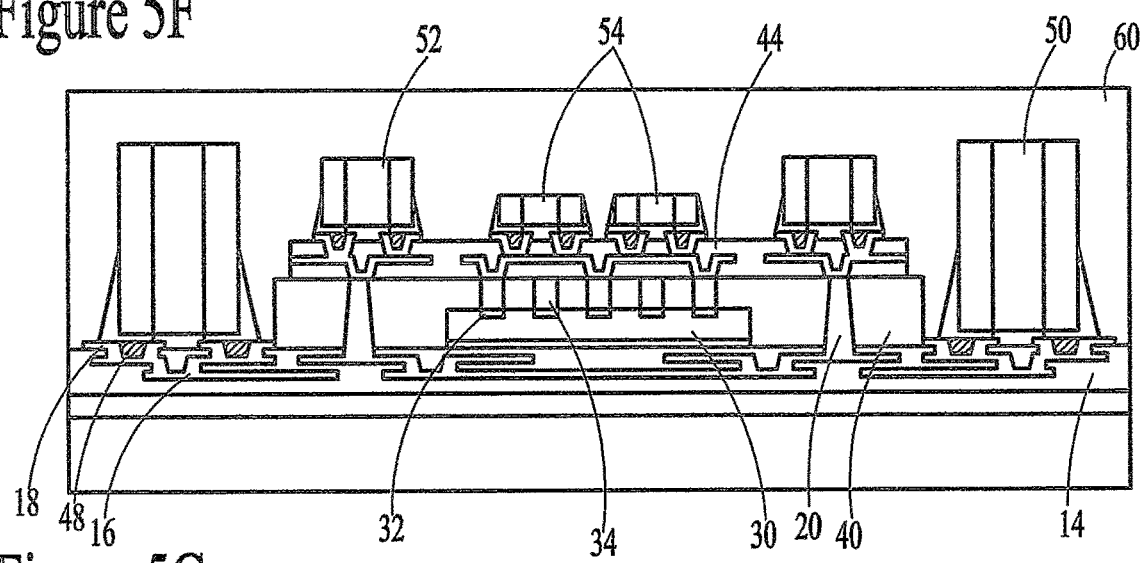
Figure 5H:
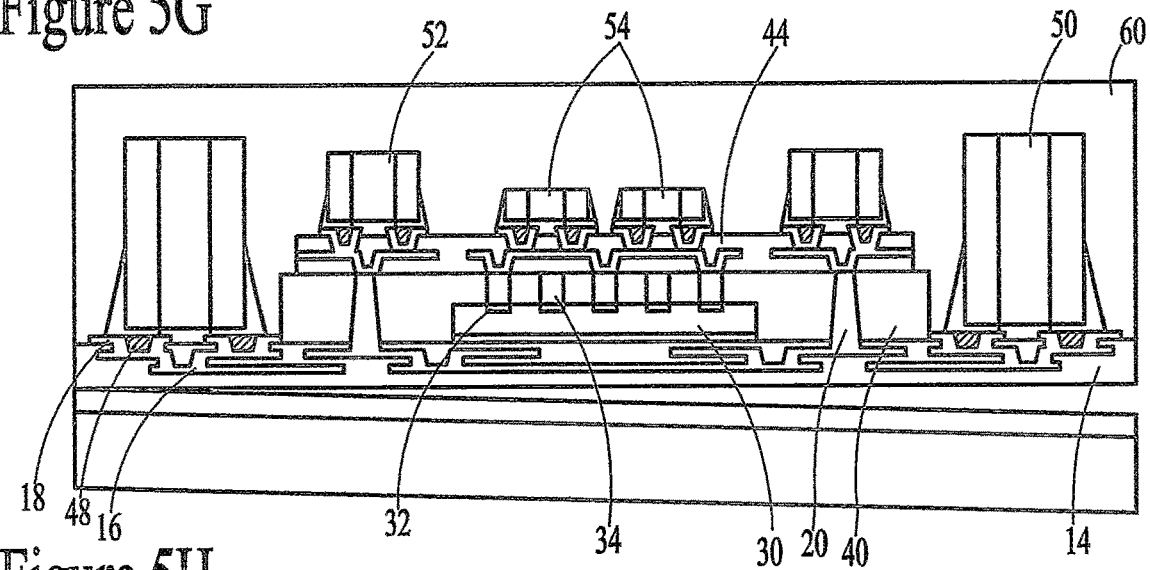
Figure 5I:
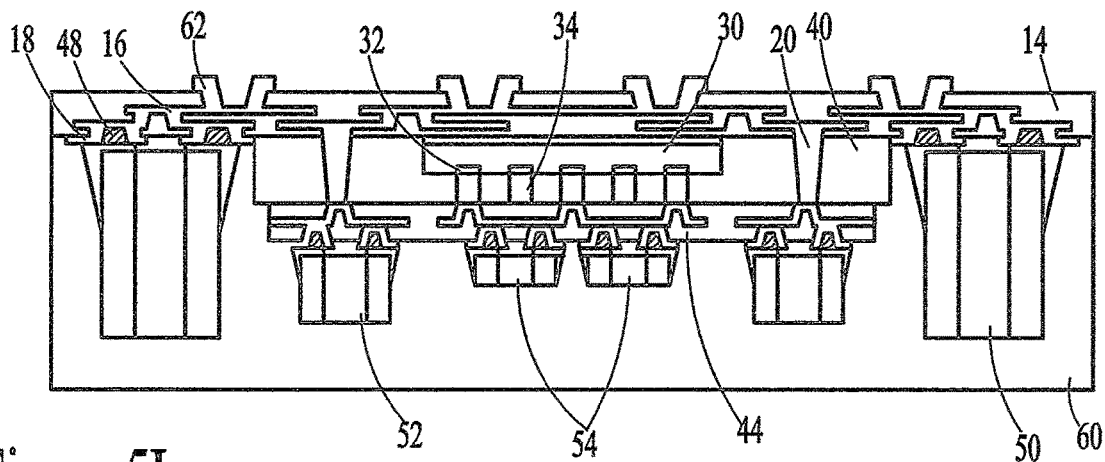
Figure 5J:
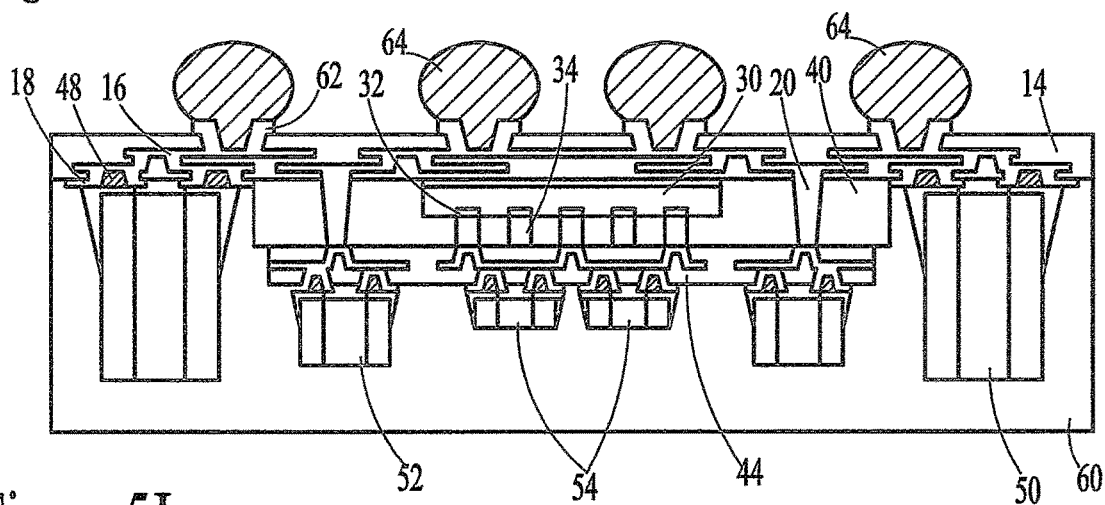
Figure 5K:
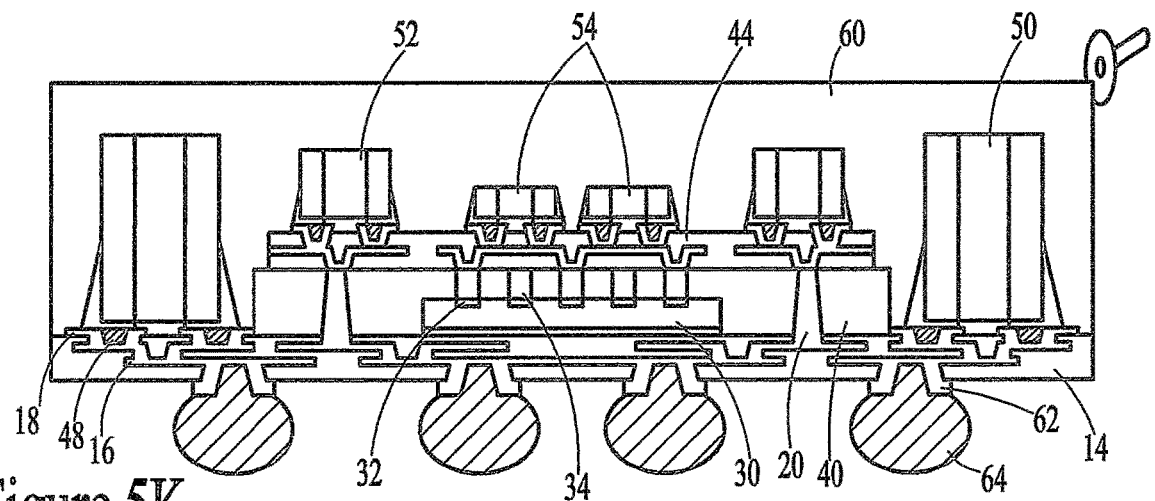

Now, as shown in FIG. 5F, passive components are mounted by surface mount technology (SMT). Passive components may include, but are not limited to, passive devices, sensors, memory, or logic, etc. The thicker/larger passive components 50 are mounted on the bottom bumping RDL 16 and side-by-side inside the mold cavity 45. Other shorter and smaller passive components 52 and 54 are mounted on the top bumping RDL interconnection 44. A second molding process coats molding compound 60 over the package for a single side modular 3D stack SiP, as illustrated in FIG. 5G. Finally the carrier 10/12 is removed (FIG. 5H). The package is flipped in FIG. 5I and UBM plating 62 is performed on the bottom of the first bumping RDL interconnection 16. Solder balls 64 are placed on the UBM connections 62, as shown in FIG. 5J. Then the packages are singulated (FIG. 5K) to create the connection for board level interconnection in each package unit.

This completes the SIP, as shown in FIG. 2. In post-processing, a printed circuit board (PCB), not shown, will be attached to the solder balls 64. The solder balls are the package output which communicate the signal between active and passive devices.

Figure 6A:
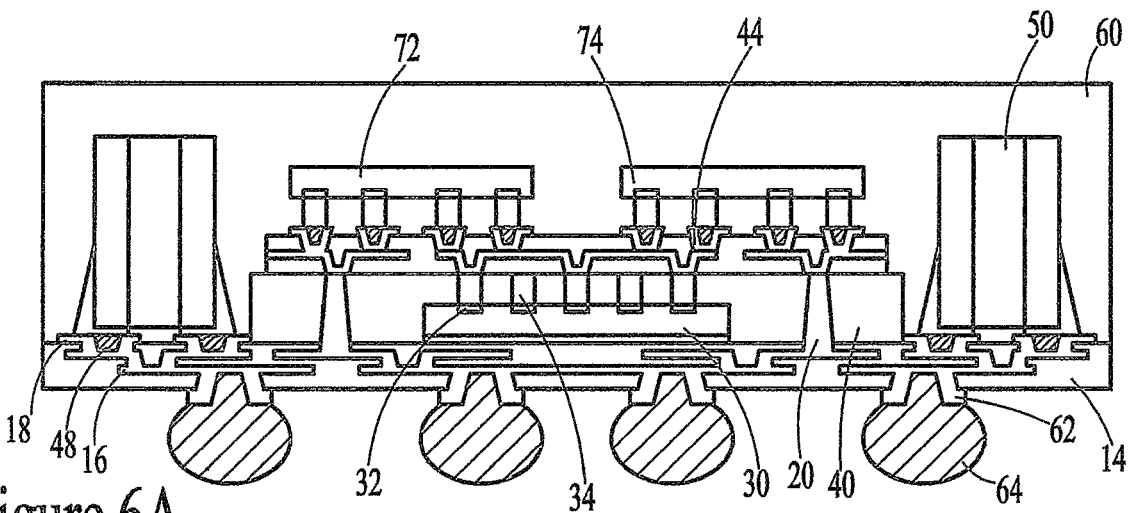
FIG. 6A is a cross-sectional representation of a system in package in a second preferred embodiment of the present disclosure.
Figure 6B:
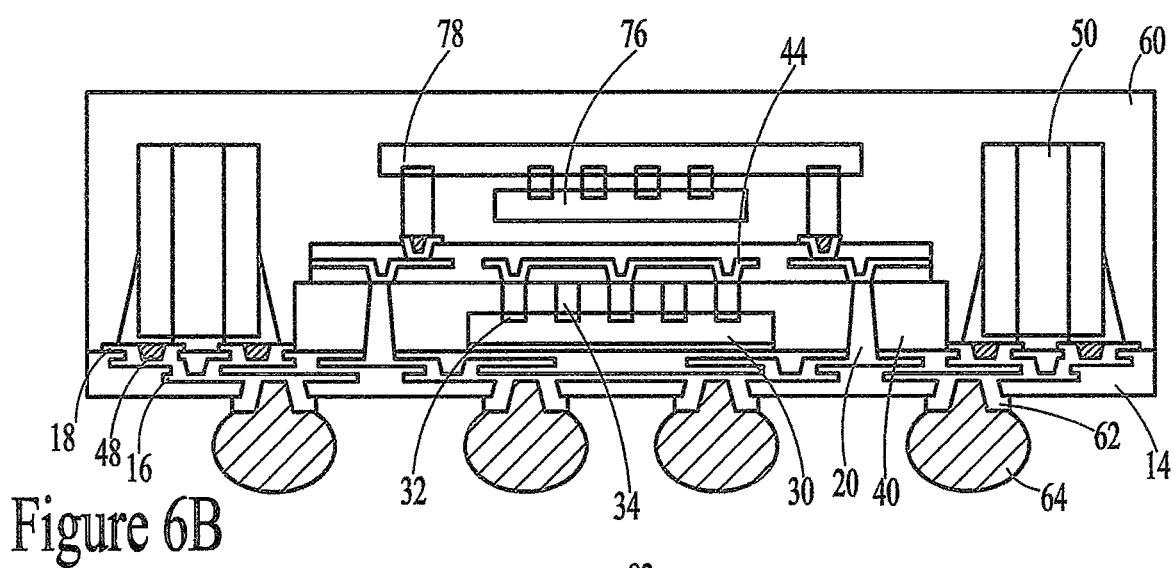
FIG. 6B is a cross-sectional representation of a system in package in a third preferred embodiment of the present disclosure.
Figure 6C:
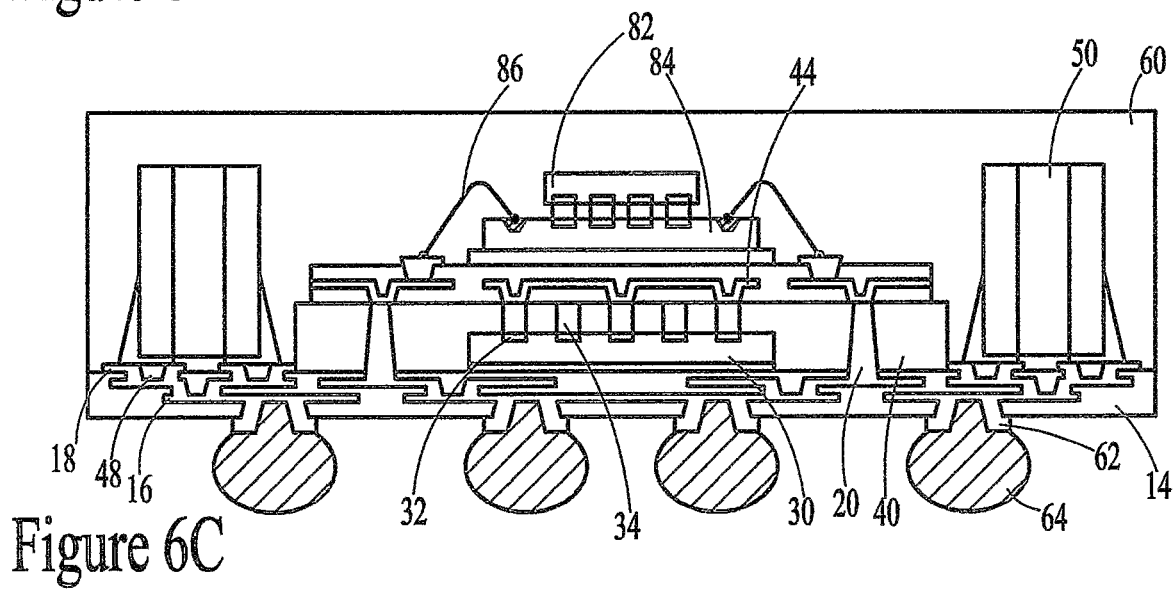
FIG. 6C is a cross-sectional representation of a system in package in a fourth preferred embodiment of the present disclosure.
Figure 6D:
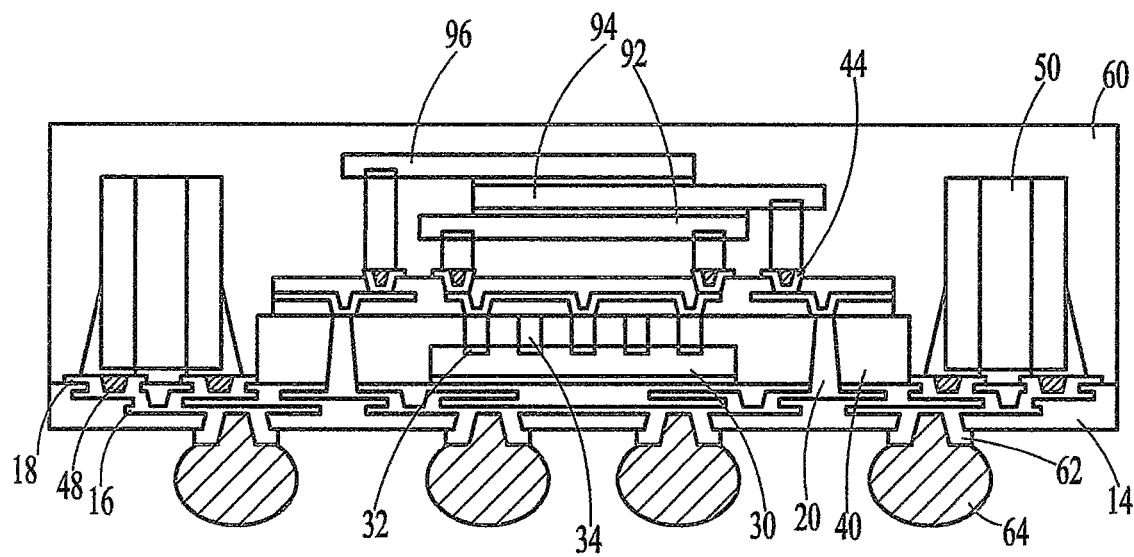
FIG. 6D is a cross-sectional representation of a system in package in a fifth preferred embodiment of the present disclosure.
Figure 6E:
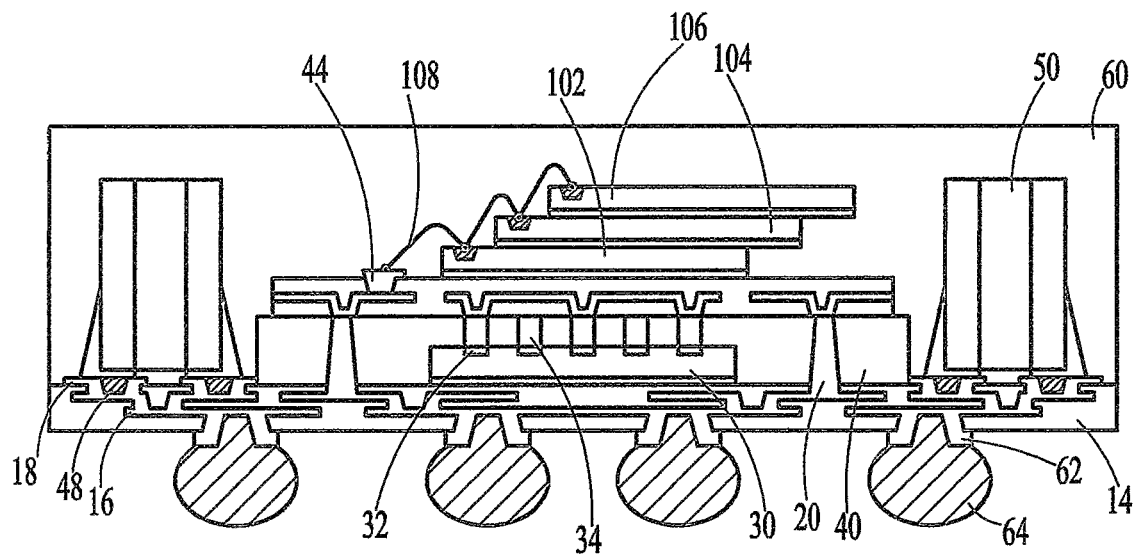
FIG. 6E is a cross-sectional representation of a system in package in a sixth preferred embodiment of the present disclosure.

FIGS. 6A-6E show several examples of package structure variations in the Single Side Modular 3D Stack SIP of the present disclosure. FIG. 6A shows additional chips 72 and 74 side-by-side on the second bumping RDL interconnection 44 over the first chip 30. FIGS. 6B and 6C illustrate face-to-face chip integration. In FIG. 6B, the second chip 76 is flip-chip attached to the third chip 78. In FIG. 6C, the second chip 82 is flip-chip attached to the third chip 84 which is die attached and wire-bonded 86 to the second bumping RDL interconnection 44. FIGS. 6D and 6E show stacking integration. Additional chips 92, 94, and 96 are stacked in a flip-chip arrangement in FIG. 6D. In FIG. 6E, additional chips 102, 104, and 106 are wire-bonded 108 to each other and to the second bumping RDL interconnection 44.

The Single Side 3D Stack Up SIP of the present disclosure has the advantage of a low profile in the total package Z height. The single-sided structure also has less warpage risk concern since there is not an unbalanced double side molding Additional advantages include expansion of integration in various package structures as 3D Stack SIP.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A system in package comprising:
   a first interconnection having redistribution layers therein and having a top surface and a bottom surface;
   at least one first silicon die mounted on said top surface of said first interconnection and embedded in a first molding compound;
   at least one first passive component mounted on said top surface of said first interconnection side-by-side with said at least one first silicon die and embedded in a second molding compound;
   a second interconnection having redistribution layers therein and having a top surface and a bottom surface and fabricated on copper posts on said top surface of said first interconnection wherein said bottom surface of said second interconnection overlies said at least one first silicon die and said first molding compound; and
   solder balls mounted on said bottom surface of said first interconnection wherein said solder balls provide package output.

2. The system in package according to claim 1 wherein said redistribution layers comprise copper.

3. The system in package according to claim 1 wherein there are three said redistribution layers.

4. The system in package according to claim 1 further comprising:
   at least one second passive component mounted on said top surface of said second interconnection wherein said at least one second passive component has a smaller height than a height of said at least one first passive component wherein said second molding compound covers said at least one first passive component and said at least one second passive component.

5. The system in package according to claim 1 further comprising:
   at least one second silicon die mounted on said top surface of said second interconnection wherein said second molding compound covers said at least one first passive component and said at least one second silicon die.

6. The system in package according to claim 1 further comprising:
   at least one second silicon die mounted on second copper posts on said top surface of said second interconnection; and
   at least one third silicon die flip-chip attached to said at least one second silicon die wherein there is a gap between said at least one third silicon die and said top surface of said second interconnection wherein said second molding compound covers said at least one first passive component, said at least one second silicon die, and said at least one third silicon die.

7. The system in package according to claim 1 further comprising:
   at least one second silicon die mounted on said top surface of said second interconnection and wire bonded to said top surface of said second interconnection; and
   at least one third silicon die flip-chip attached to said at least one second silicon die on a side of said at least one second silicon die opposite to said second interconnection wherein said second molding compound covers said at least one first passive component, said at least one second silicon die, and said at least one third silicon die.

8. The system in package according to claim 1 further comprising:
   at least one second silicon die mounted on second copper posts on said top surface of said second interconnection; and
   at least one third silicon die stacked on said at least one second silicon die and at least one third copper post on said top surface of said second interconnection wherein said second molding compound covers said at least one first passive component, said at least one second silicon die, and said at least one third silicon die.

9. The system in package according to claim 1 further comprising:
   at least one second silicon die mounted on said top surface of said second interconnection and wire-bonded to said top surface of said second interconnection; and
   at least one third silicon die stacked on said at least one second silicon die and wire-bonded to said at least one second silicon die wherein said second molding compound covers said at least one first passive component, said at least one second silicon die, and said at least one third silicon die.

10. The system in package according to claim 1 wherein:
at least one second silicon die is mounted on second copper posts on said top surface of said second interconnection; and
at least one third silicon die is flip-chip attached to said at least one second silicon die wherein there is a gap between said at least one third silicon die and said top surface of said second interconnection wherein said second molding compound covers said at least one first passive component, said at least one second silicon die, and said at least one third silicon die.

11. The system in package according to claim 1 wherein:
at least one second silicon die is mounted on said top surface of said second interconnection and wire bonded to said top surface of said second interconnection; and
at least one third silicon die is flip-chip attached to said at least one second silicon die on a side of said at least one second silicon die opposite to said second interconnection wherein said second molding compound covers said at least one first passive component, said at least one second silicon die, and said at least one third silicon die.

12. The system in package according to claim 1 wherein:
at least one second silicon die is mounted on second copper posts on said top surface of said second interconnection; and
at least one third silicon die is stacked on said at least one second silicon die and at least one third copper post on said top surface of said second interconnection wherein said second molding compound covers said at least one first passive component, said at least one second silicon die, and said at least one third silicon die.

13. The system in package according to claim 1 wherein:
at least one second silicon die is mounted on said top surface of said second interconnection and wire-bonded to said top surface of said second interconnection; and
at least one third silicon die is stacked on said at least one second silicon die and wire-bonded to said at least one second silicon die wherein said second molding compound covers said at least one first passive component, said at least one second silicon die, and said at least one third silicon die.

14. A system in package comprising:
a first interconnection having redistribution layers therein and having a top surface and a bottom surface and having first copper posts on said top surface;
at least one first silicon die mounted on said top surface of said first interconnection not on said first copper posts wherein said at least one silicon die and said first copper posts are embedded in a first molding compound except for tops of said first copper posts and tops of copper pillars on a top surface of said at least one first silicon die;
at least one first passive component mounted on said top surface of said first interconnection side-by-side with said at least one first silicon die;
a second interconnection having redistribution layers therein and having a top surface and a bottom surface and fabricated on said first copper posts on said top surface of said first interconnection wherein said bottom surface of said second interconnection overlies said at least one first silicon die and said first molding compound;
at least one active or passive component mounted on a top surface of said second interconnection wherein said at least one first passive component, said second interconnection, and said at least one active or passive component are embedded in a second molding compound; and
solder balls mounted on said bottom surface of said first interconnection wherein said solder balls provide package output.

\* \* \* \* \*